United States Patent [19]
Tomita

[11] Patent Number: 5,959,353
[45] Date of Patent: Sep. 28, 1999

[54] SEMICONDUCTOR DEVICE

[75] Inventor: Yoshihiro Tomita, Tokyo, Japan

[73] Assignee: Mitsubishi Denki Kabushiki Kaisha, Tokyo, Japan

[21] Appl. No.: 09/066,859

[22] Filed: Apr. 27, 1998

[30] Foreign Application Priority Data

Aug. 28, 1997 [JP] Japan .................................... 9-231928

[51] Int. Cl.⁶ .................................................. H01L 23/06
[52] U.S. Cl. ........................... 257/729; 257/700; 257/703
[58] Field of Search .................... 257/700, 702, 257/709, 711, 729, 678, 703

[56] References Cited

U.S. PATENT DOCUMENTS 5,343,076  8/1994  Katayama et al. ..................... 257/717
5,500,555  3/1996  Ley ........................................ 257/700

FOREIGN PATENT DOCUMENTS 7135271  5/1995  Japan .

*Primary Examiner*—Olik Chaudhuri
*Assistant Examiner*—Nathan Kelley
*Attorney, Agent, or Firm*—Leydig, Voit & Mayer, Ltd.

[57] ABSTRACT

A semiconductor device includes a plastic substrate with a multilayer structure having electrically conductive lines and an embedded planar metal layer, a semiconductor chip having electrodes connected to respective lines by solder, and a sealing member of a synthetic resin adhering the semiconductor chip tightly to the plastic substrate.

4 Claims, 5 Drawing Sheets

SEMICONDUCTOR DEVICE

BACKGROUND OF THE INVENTION

The present invention relates to a package structure of a semiconductor device. More particularly, it relates to a package structure of a semiconductor device having a BGA (ball grid array) structure in which balls used in soldering when mounting a semiconductor device on a product are arranged at the back side of a substrate in a matrix.

A conventional semiconductor device comprises a BGA substrate, a semiconductor chip disposed on the BGA substrate, a heat spreader for dispersing the heat generated on the semiconductor chip externally, and a ring for keeping a specific interval between the BGA substrate and heat spreader and joining the two. The BGA substrate has a multilayer structure in which plural insulating substrates are laminated, and plural wires and via holes are formed in each insulating substrate. The BGA substrate is formed by mutually connecting specified wires through via holes when laminating plural substrates, and the plural wires cross three-dimensionally through the insulating substrates, so that the semiconductor device can be reduced in size.

FIG. 4 is a partially cut-away perspective explanatory diagram showing an example of a conventional semiconductor device. In FIG. 4, reference numeral 1 denotes a plastic substrate which is a BGA substrate, 2 denotes a semiconductor chip, 3 denotes a heat spreader, 4 denotes a ring, 6 denotes a solder ball, and 8 denotes a sealing member.

Each line (not shown) provided on the plastic substrate 1 is connected electrically to an external electrode (not shown) of the semiconductor device. Solder balls 6 are made of solder, and are electrically connected to the external electrode of the semiconductor device. Plural electrodes (not shown) of the semiconductor chip 2 are electrically connected to the specified lines of the plastic substrate 1, respectively. Such connection is realized, for example, by forming preliminarily solder bumps on each electrode surface of the semiconductor chip 2 and external electrode surface connected to each line of the plastic substrate 1, and soldering by using these solder bumps. The sealing member 8 is composed of a synthetic resin for sealing, and is provided in order to connect the semiconductor chip 2 tightly to the plastic substrate 1. That is, the sealing member 8 is provided in order to prevent breakage at the connection of the lines of the plastic substrate 1 and electrodes of the semiconductor chip 2 due to warp of plastic substrate or the like.

The ring 4 has an opening in the center of a plate member, and the shape of the opening is determined depending on the shape of the semiconductor chip 2. The shape of the heat spreader 3 is a thin plate similar to the shape of the plastic substrate 1, and the semiconductor chip 2 and heat spreader 3, plastic substrate 1 and ring 4, and heat spreader 3 and ring 4 are adhered together by adhesives. The adhesives for adhering the semiconductor chip 2 and heat spreader are adhesives having a high heat releasing property, for example, silicone or epoxy derivative. On the other hand, the adhesive for adhering the plastic substrate 1 and ring, and heat spreader 3 and ring 4 is a film adhesives of, for example, epoxy resin.

An example of manufacturing method of the semiconductor device is described below. FIGS. 5(a) to 5(d) and FIGS. 6(a) to 6(c) are process sectional explanatory views showing an example of a manufacturing method of a conventional semiconductor device. In FIGS. 5(a) to 5(d) and FIGS. 6(a) to 6(c), same parts as in FIG. 4 are identified with same reference numerals. Reference numeral 5a denotes a first solder bump electrically connected to an electrode (not shown) contained in the semiconductor chip 2, and 5b denotes a second solder bump electrically connected to an end (not shown) of plural lines provided in the plastic substrate 1. Reference numeral 7a denotes a first adhesive layer comprising an adhesive for adhering the plastic substrate 1 and ring 4, and heat spreader 3 and ring 4, and 7b denotes a second adhesives layer comprising adhesives for adhering the semiconductor chip 2 and heat spreader 3.

At the beginning, the first solder bump 5a is provided on the electrode contained in the semiconductor chip 2, and similarly the second solder bump 5b is provided on one end of plural lines of the plastic substrate 1 (see FIG. 5(a)). Next, on the surface of the plastic substrate 1, a flux material is applied in the region in which the second solder bump 5b is formed. The semiconductor chip 2 is mounted on the plastic substrate 1, and the first solder bump 5a and second solder bump 5b are brought into mutual contact, and the plastic substrate 1 and semiconductor chip 2 are charged into a heating furnace (so-called reflow furnace). As a result, the first solder bump 5a and second solder bump 5b are melted, and the mutually contacting first solder bump 5a and second solder bump 5b are formed into one body. In FIGS. 5(a)–5(d), a combined form of the first solder bump 5a and second solder bump 5b is indicated as the solder bump 5. By this solder bump 5, the electrode included in the semiconductor chip 2 and the plural lines of the plastic substrate 1 are electrically connected (see FIG. 5(b)). Moreover, after cleaning the flux material, the ring 4 is adhered to the plastic substrate 1 through the first adhesive layer 7a (see FIG. 5(c)). Next, a synthetic resin for sealing is injected in the gap between the plastic substrate 1 and semiconductor chip 2, and solidified to form a sealing member 8, and through this sealing member 8, the semiconductor chip 2 is fixed tightly to the plastic substrate 1. Then, the adhesives are applied on the surface of the semiconductor chip 2, and a second adhesive layer 7b is formed (see FIG. 6(a)), and the adhesives are applied on the surface of the ring 4 to form a first adhesive layer 7a, and the heat spreader 3 provided on the semiconductor chip 2 and ring 4, and the heat spreader 3 is adhered to the semiconductor chip 2 and ring 4 (see FIG. 6(b)). Finally, solder balls 6 formed on the external electrode of the semiconductor device connected to the other end of the plural lines of the plastic substrate 1, and a semiconductor device is obtained (see FIG. 6(c)).

In the conventional semiconductor device, a plastic substrate is used when forming the BGA substrate. The plastic substrate is relatively easy to permeate moisture. Therefore, in the process of use of semiconductor device, the sealing member may deteriorate due to moisture taken into the semiconductor device through the plastic substrate. As a result, the adhesion between the sealing member and plastic substrate may be weaker.

In consideration of such problem, for example, Japanese Unexamined Patent Publication No. 288686/1996 discloses a semiconductor device capable of preventing moisture absorption into the plastic substrate by forming a thin metal film on the surface of the semiconductor device by electroless plating. Such thin metal plate, however, may have effects on the electric characteristic of the semiconductor device, and it cannot be formed in the region where solder bumps are formed, and therefore it is not an effective measure of solving the problem in spite of the high manufacturing cost.

It is hence an object of the invention to solve the above problems and present a semiconductor device strong in adhesion between the sealing member and plastic substrate.

SUMMARY OF THE INVENTION

A semiconductor device according to the present invention comprises a plastic substrate with multilayer structure having plural lines, a semiconductor chip having plural electrodes connected to the plural wires respectively by using a solder material, and a sealing member having a sealing resin for adhering the semiconductor chip tightly to the plastic substrate, in which a planar metal layer is provided in the plastic substrate.

In a semiconductor device according to the present invention, the planar metal layer is provided beneath the semiconductor chip.

In a semiconductor device according to the present invention, the shape of the planar metal layer is either plate or mesh.

In a semiconductor device of the present invention, the thickness of the metal plain layer is 0.01 to 0.03 mm.

A semiconductor device of the present invention is a semiconductor device comprising a plastic substrate in multilayer structure having plural wires, a semiconductor chip having plural electrodes connected to the plural wires respectively by using a solder material, and a sealing member having a sealing resin for adhering the semiconductor chip tightly to the plastic substrate, in which a solder resist film is provided on the surface of the plastic substrate, and the semiconductor chip side surface of the solder resist film is processed by roughening.

In a semiconductor device of the invention, the roughening process is a dry etching process.

In a semiconductor device of the invention, the roughening process is a dry etching process by using reactive ion etching or plasma etching.

A semiconductor device of the invention comprises a plastic substrate in multilayer structure having plural lines, a semiconductor chip having plural electrodes connected to the plural lines respectively by using a solder material, and a sealing member having a synthetic resin for adhering the semiconductor chip tightly to the plastic substrate, in which a solder resist film is provided on the surface of the plastic substrate, each electrode of the semiconductor chip is connected to each line of the plastic substrate through solder bumps made of solder material and the solder resist film, the peripheral area of the portion of the solder resist film contacting with the solder bump is removed in a ring form, and the solder resist film removed region of the solder resist film surface and the plastic substrate surface is processed by roughening.

In a semiconductor device of the present invention, the roughening process is a dry etching process.

In a semiconductor device of the present invention, the roughening process is a dry etching process by using reactive ion etching or plasma etching.

A semiconductor device of the present invention comprises a plastic substrate in multilayer structure having plural lines, a semiconductor chip having plural electrodes connected to the plural lines respectively by using a solder material, a sealing member having a synthetic resin for adhering the semiconductor chip tightly to the plastic substrate, a heat spreader for dispersing heat generated in the semiconductor chip to outside, and a ring for keeping a specific interval between the plastic substrate and heat spreader and joining the two, in which a metal plain layer is provided in the plastic substrate.

A semiconductor device of the present invention comprises a plastic substrate in multilayer structure having plural lines, a semiconductor chip having plural electrodes connected to the plural lines respectively by using a solder material, a synthetic member having a synthetic resin for adhering the semiconductor chip tightly to the plastic substrate, a heat spreader for dispersing heat generated in the semiconductor chip to outside, and a ring for keeping a specific interval between the plastic substrate and heat spreader and joining the two, in which a solder resist film is provided on the surface of the plastic substrate, and the semiconductor chip side surface of the solder resist film is processed by roughening.

A semiconductor device of the present invention comprises a plastic substrate in multilayer structure having plural lines, a semiconductor chip having plural electrodes connected to the plural lines respectively by using a solder material, a sealing member having a synthetic resin for adhering the semiconductor chip tightly to the plastic substrate, a heat spreader for dispersing heat generated in the semiconductor chip to outside, and a ring for keeping a specific interval between the plastic substrate and heat spreader and joining the two, in which a solder resist film is provided on the surface the plastic substrate, each electrode of the semiconductor chip is connected to each line of the plastic substrate through solder bumps made of solder material and the solder resist film, the portion of the solder resist film contacting with the solder bump and its peripheral area are removed in a circular form, and the solder resist film surface and the solder resist film removed region of the plastic substrate surface are processed by roughening.

DETAILED DESCRIPTION OF THE INVENTION

Embodiments of semiconductor device of the present invention are described in detail below.

Embodiment 1

Referring now to a drawing, an embodiment of a semiconductor device of the present invention is described below.

Figure 1:
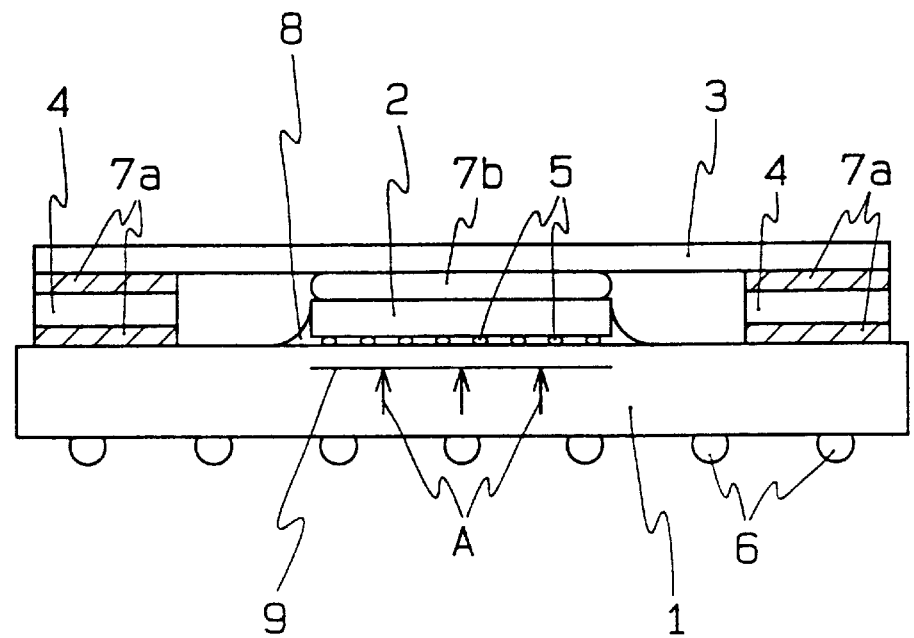
FIG. 1 is a sectional explanatory view showing Embodiment 1 of a semiconductor device of the present invention.

FIG. 1 is a sectional explanatory diagram showing embodiment 1 of a semiconductor device of the present invention. In FIG. 1, same parts as in FIG. 5(a) to 5(d) and FIG. 6(a) to 6(c) are identified with same reference numerals.

Reference numeral 9 denotes a planar metal layer provided in the plastic substrate.

In this embodiment, a metal plain layer is provided in the plastic substrate of multilayer structure of the semiconductor device. In FIG. 1, only one metal plain layer 9 is shown schematically, but actually it is formed on plural insulating substrate surfaces for composing the plastic substrate, while avoiding lines and via holes provided in the insulating substrates. The metal plain layer 9 is made of a metal, and does not absorb moisture as compared with the plastic substrate 1. Therefore, the moisture permeating into the plastic substrate 1 from outside of the semiconductor device (from the direction indicated by arrow A in the diagram) can be shut off by the metal plain layer 9, and hence deterioration of the sealing member 8 can be prevented. As a result, the adhesion between the sealing member and plastic substrate can be reinforced.

The metal plain layer 9 may be provided either beneath the semiconductor chip 2 or on the entire plastic substrate 1. When the metal plain layer 9 is provided beneath the semiconductor chip 2, reduction of manufacturing cost and simplification of manufacturing process may be realized. The shape of the metal plain layer 9 may be either plate or mesh. When the shape of the metal plain layer 9 is mesh, the porosity of the metal plain layer 9 is, for example, 20 to 30%. More preferably, the thickness of the metal plain layer 9 should be 0.01 to 0.03 mm in order to shut off sufficiently the moisture permeating into the plastic substrate 1.

As the material for the metal plain layer 9, for example, copper is preferred because it is excellent in electric characteristic.

Embodiment 2

Referring now to a drawing, other embodiment of a semiconductor device of the present invention is described below.

Figure 2:
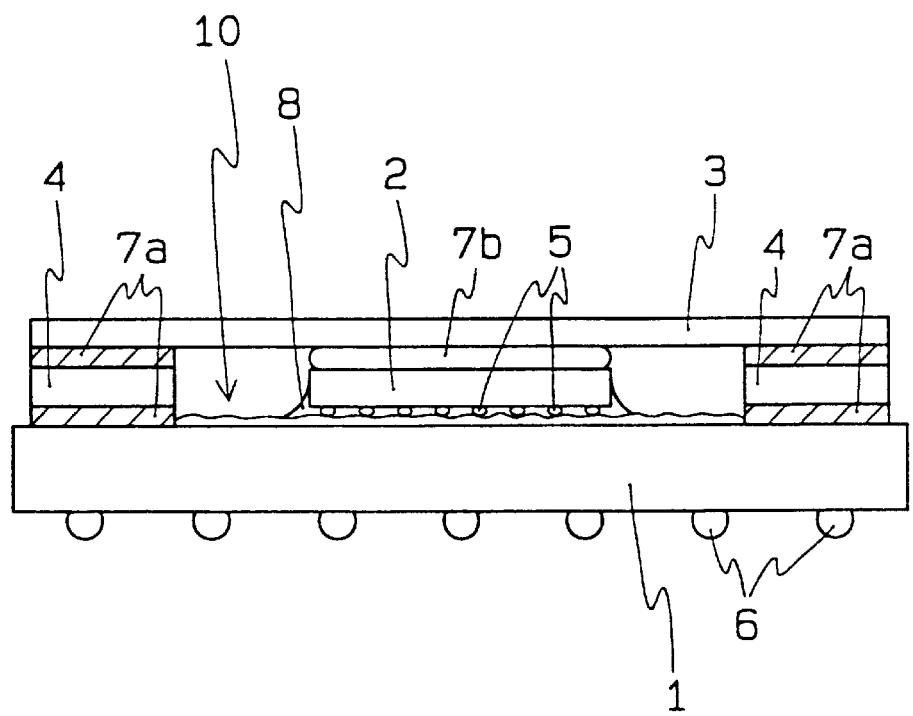
FIG. 2 is a sectional explanatory view showing Embodiment 2 of a semiconductor device of the present invention.

FIG. 2 is a sectional explanatory diagram showing embodiment 2 of a semiconductor device of the present invention. In FIG. 2, same parts as in FIG. 1 are identified with same reference numerals. Reference numeral 10 denotes a solder resist film provided on the surface of the plastic substrate 1. The solder resist film 10 is provided on the plastic substrate surface in order to prevent from excessively wetting up to the lines (not shown) in the plastic substrate 1.

In the embodiment, the semiconductor chip side surface of the solder resist film 10 is processed by roughening. By roughening the solder resist film 10, the surface of the solder resist film 10 is undulated, and the adhesion between the sealing member 8 and solder resist film 10 is reinforced. As a result, the adhesion between the semiconductor chip 2 and plastic substrate 1 is reinforced.

Embodiment 3

Referring now to a drawing, a different embodiment of a semiconductor device of the present invention is described below.

Figure 3:
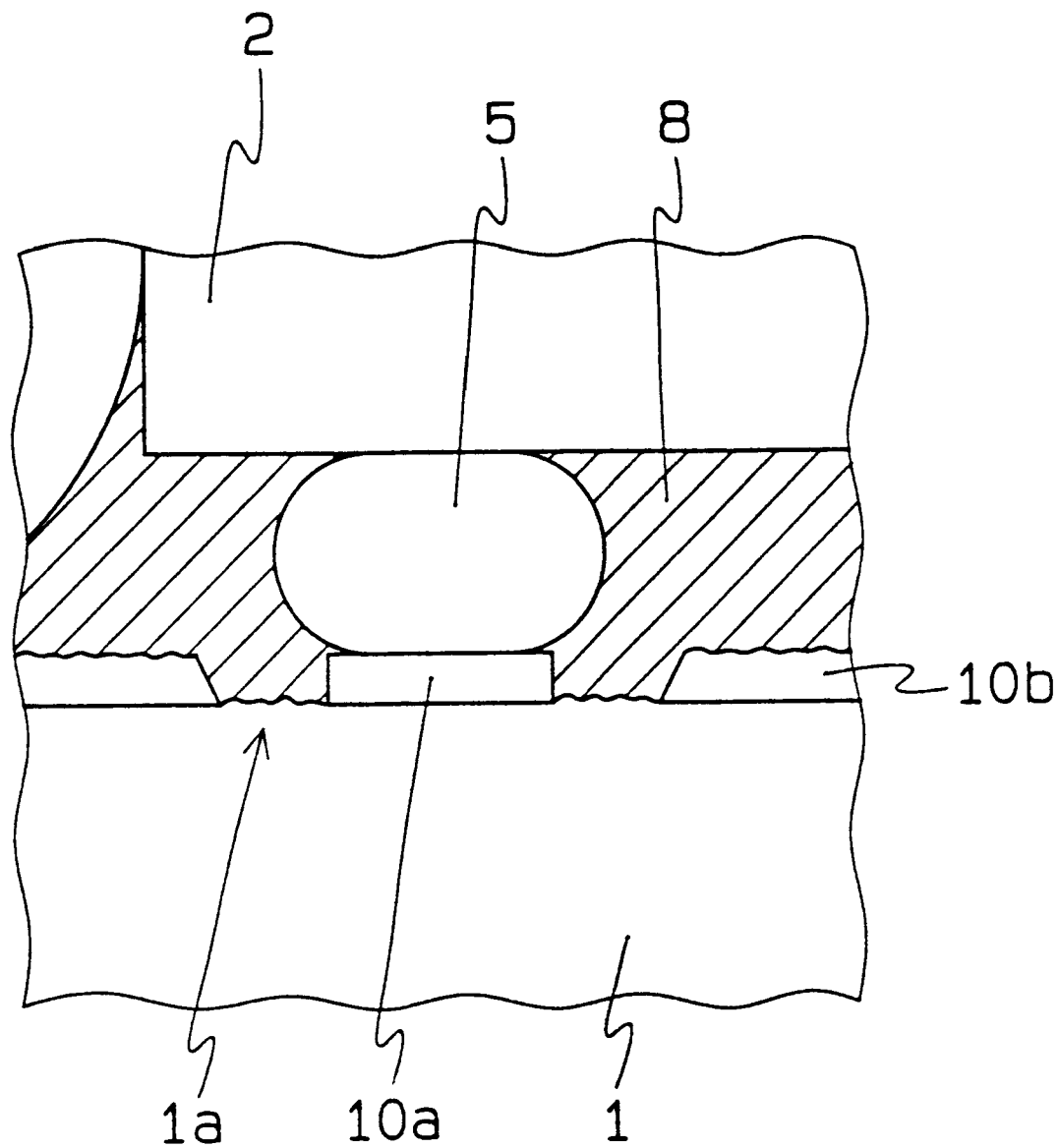
FIG. 3 is a partially enlarged explanatory view showing Embodiment 3 of a semiconductor device of the present invention.
Figure 4:
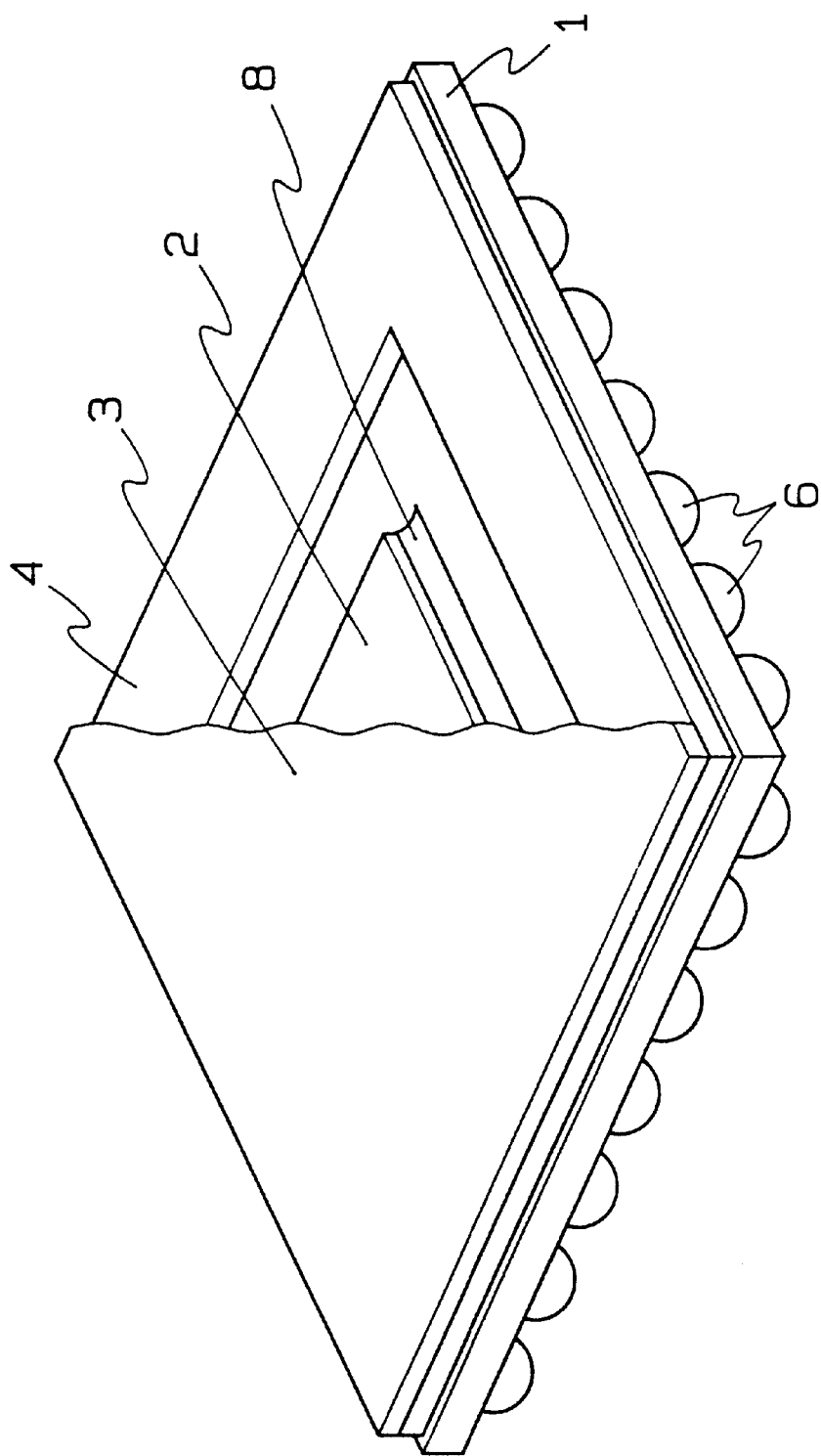
FIG. 4 is a partly broken away perspective explanatory view showing an example of conventional semicondcutor device.
Figure 5A:
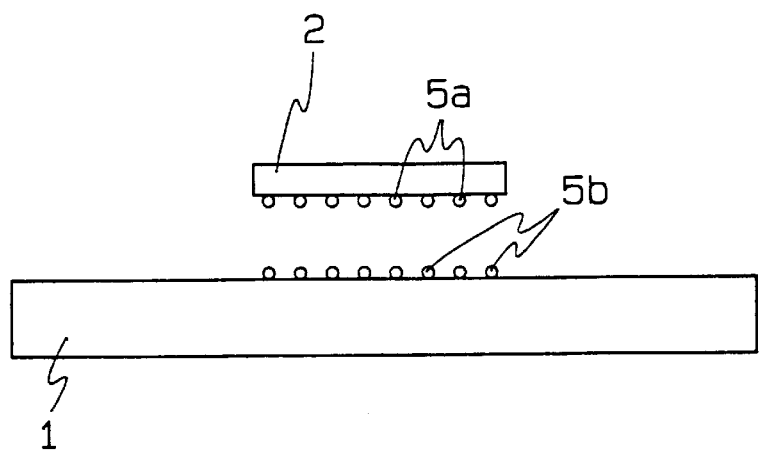
FIGS. 5(a)–5(d) are sectional explanatory views showing an example of conventional method for producing semiconductor device.
Figure 5B:
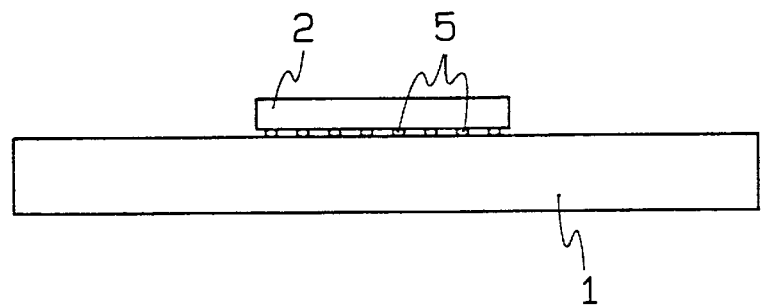
Figure 5C:
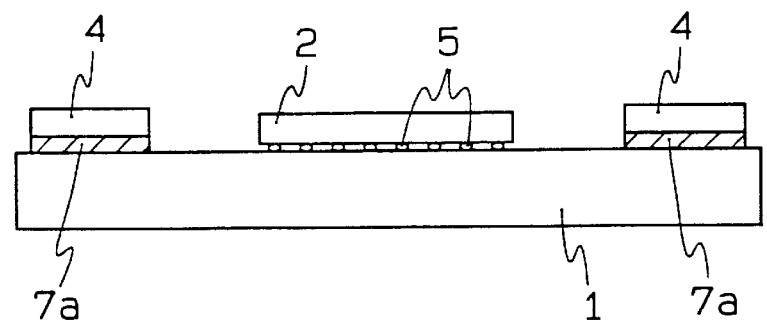
Figure 5D:
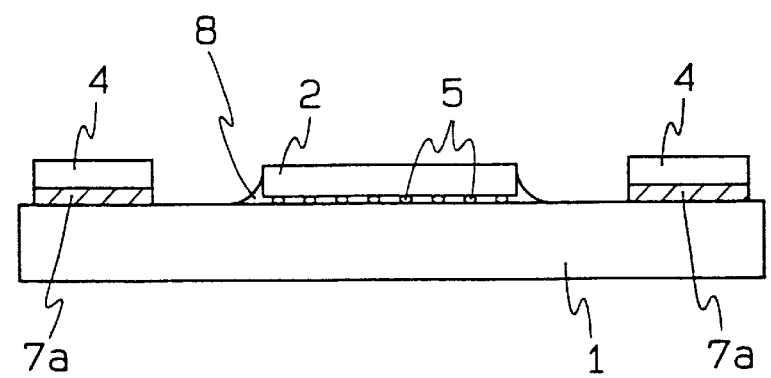
Figure 6A:
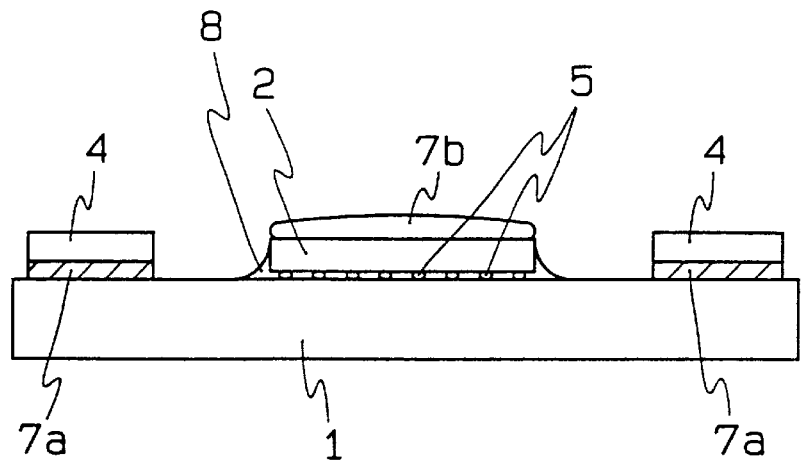
FIGS. 6(a)–6(c) are sectional explanatory views showing an example of conventional method for producing semiconductor device.
Figure 6B:
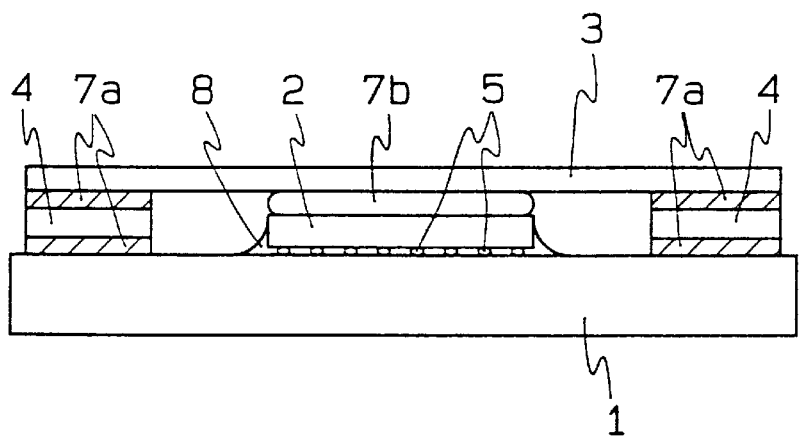
Figure 6C:
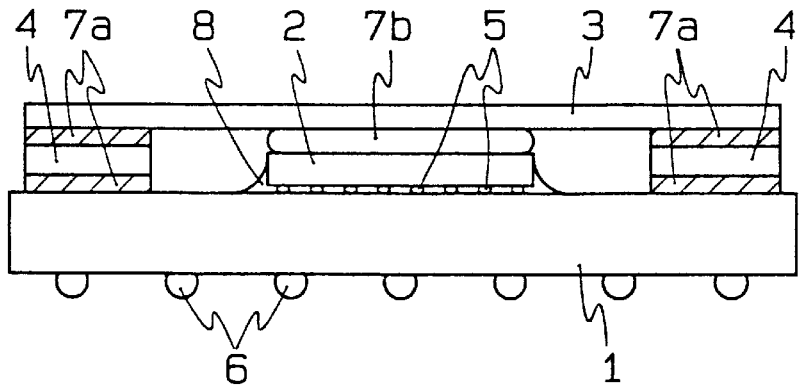

FIG. 3 is a partially magnified sectional explanatory diagram showing embodiment 3 of a semiconductor device of the present invention. In FIG. 3, same parts as in FIG. 1 are identified with same reference numerals. FIG. 3 shows only the solder bump and its periphery, in particular, of the semiconductor device.

In this embodiment, of the solder resist film provided on the surface of the plastic substrate 1, the portion contacting with the solder bump 5 and its peripheral part are removed in a circular form. In FIG. 3, the lower portion of the solder bump 5 of the line in the plastic substrate 1 is particularly called the land, and indicated by reference numeral 10a. The land 10a is formed in order to connect with a terminal (an electrode) of the semiconductor chip.

In this embodiment, of the surface of the plastic substrate 1, the region (indicated by reference numeral 1a in the drawing) exposed by removing the solder resist film in an circular form, and the surface of the solder resist film 10b are processed by roughening. By the roughening process, the adhesion of the sealing member 8 and solder resist film 10b is reinforced. Generally, in the peripheral area of the solder bump 5, breakage is likely to occur, and it is particularly needed to reinforce the adhesion. In the embodiment, by roughening also the exposed region 1a, the adhesion of the peripheral area of the solder bump 5 with the solder resist film 10 can be reinforced.

In Embodiment 2 and Embodiment 3, as the material for the solder resist film, epoxy resin or acrylic resin may be used. Alternatively, the epoxy resin or acrylic resin may be also mixed with a filler. As the roughening process, dry etching may be employed. As an example of dry etching, reactive ion etching or plasma etching may be employed.

In the semiconductor device shown in Embodiment 2 and Embodiment 3, further, the metal plain layer of the semiconductor device shown in embodiment 1 may be also provided.

In the embodiments, as an example of the semiconductor device, the semiconductor device comprises the heat spreader and ring, but same effects are obtained also in the semiconductor device not comprising heat spreader or ring.

Though several embodiments of the present invention are described above, it is to be understood that the present invention is not limited only to the above-mentioned, various changes and modifications may be made in the invention without departing from the spirit and scope thereof.

What is claimed is:

1. A semiconductor device comprising:

a plastic substrate with a multilayer structure having plural electrically conductive lines, containing a planar metal layer, and having a surface;

a solder resist film disposed on the surface of the plastic substrate to control wetting of the electrically conductive lines by solder;

a semiconductor chip having plural electrodes respectively connected to corresponding electrically conductive lines by solder; and a sealing member of a synthetic resin adhering to the solder resist film whereby the semiconductor chip is tightly urged toward the plastic substrate, wherein the solder resist film has a roughened undulating surface reinforcing adhesion to the sealing member and the planar metal layer is embedded within the plastic substrate for preventing moisture from penetrating through the substrate to the sealing member.

2. The semiconductor device of claim 1, wherein the planar metal layer is disposed opposite the semiconductor chip.

3. The semiconductor device of claim 2, wherein the planar metal layer is a plate.

4. The semiconductor device of claim 2, wherein the planar metal layer is a mesh.

* * * * *